United States Patent
Choi et al.

(10) Patent No.: US 8,089,774 B2
(45) Date of Patent: Jan. 3, 2012

(54) PRINTED CIRCUIT BOARD AND SEMICONDUCTOR MEMORY MODULE USING THE SAME

(75) Inventors: Hyun-Seok Choi, Cheonan-si (KR); Yong-Hyun Kim, Suwon-si (KR); Jung-Chan Cho, Ssangyong-dong (KR); Hyung-Mo Hwang, Ssangyong-dong (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1041 days.

(21) Appl. No.: 12/000,930

(22) Filed: Dec. 19, 2007

(65) Prior Publication Data

US 2008/0149372 A1    Jun. 26, 2008

(30) Foreign Application Priority Data

Dec. 20, 2006  (KR) .................. 10-2006-0131083

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/749; 361/803; 174/254

(58) Field of Classification Search .......... 361/749–750, 361/803; 174/254–258
See application file for complete search history.

(56) References Cited

U.S. PATENT DOCUMENTS 5,220,488 A * 6/1993 Denes ............................ 361/749
5,224,023 A * 6/1993 Smith et al. .................... 361/784

FOREIGN PATENT DOCUMENTS

| JP | 09/199665 | 7/1997 |
| JP | 10-284684 | 10/1998 |
| KR | 1020040079780 A | 9/2004 |
| KR | 1020060050487 A | 5/2006 |

* cited by examiner

*Primary Examiner* — Tuan T Dinh
(74) *Attorney, Agent, or Firm* — Harness, Dickey & Pierce, P.L.C.

(57) ABSTRACT

A semiconductor memory module includes a printed circuit board (PCB) including a rigid PCB part and a flexible PCB part including an overlap portion, a non-overlap portion, and memory components mounted on the PCB. The rigid PCB part includes a first surface and a second surface facing the first surface. The overlap portion of the flexible PCB part overlaps the rigid PCB part, and the non-overlap portion does not overlap the rigid PCB part. The flexible PCB part may include an overlap stacked structure including at least one doubling portion.

12 Claims, 7 Drawing Sheets

PRINTED CIRCUIT BOARD AND SEMICONDUCTOR MEMORY MODULE USING THE SAME

PRIORITY STATEMENT

This U.S. non-provisional patent application claims priority under 35 U.S.C. §119 to Korean Patent Application No. 10-2006-131083 filed on Dec. 20, 2006 in the Korean Intellectual Property Office (KIPO), the entire contents of which are incorporated by reference.

BACKGROUND

The widespread use and rapid advancement of the internet increased consumer demand for a semiconductor memory module with greater memory capacity. Semiconductor memory modules are being developed towards improving high density mounting such as stacking semiconductor devices. A semiconductor memory module may include a device extending memory capacity in an electronic circuit system such as a personal computer (PC) or a mass-storage workstation. A semiconductor memory module may include a printed circuit board (PCB) on which a plurality of semiconductor memory chips are mounted.

Conventional semiconductor memory modules may lack the increased memory capacity consumers demand because not only the area where semiconductor memory chips are mounted is limited, but also due to the rising cost of increasing integration density.

FIGS. 1A and 1B are a perspective view and a side view illustrating a conventional semiconductor memory module, respectively.

Referring to FIGS. 1A and 1B, a semiconductor memory module may include a PCB 10 and memory components 20. The PCB 10 may be a rigid PCB, and the memory components 20 may be a semiconductor memory chip or a semiconductor memory package.

The PCB 10 may include connector connecting pins 12 provided at one end to be electrically connected to a main board of an electronic circuit system such as a personal computer (PC) or a workstation when the PCB 10 is inserted into a connector of the main board. The memory components 20 may be mounted on a first surface of the PCB and a second surface facing the first surface using a mounting device 25.

SUMMARY

Example embodiments are directed to a PCB and a semiconductor memory module. In example embodiments, the PCB may include a rigid PCB part including a first surface and a second surface facing the first surface, a flexible PCB part including an overlap portion overlapping the rigid PCB part, and a non-overlap portion not overlapping the rigid PCB part, wherein the flexible PCB part includes an overlap stacked structure including at least one doubling portion.

Example embodiments provide a semiconductor module with a PCB capable of mounting an increasing number of semiconductor memory chips for realizing higher integration density in a more cost effective way.

Example embodiments are directed to a semiconductor memory module. In an example embodiment, the semiconductor memory module may include a PCB including a rigid PCB part including a first surface and a second surface facing the first surface, a flexible PCB part including an overlap portion overlapping the rigid PCB part, a non-overlap portion not overlapping the rigid PCB part, and memory components mounted on the PCB, wherein the flexible PCB part includes an overlap stacked structure including at least one doubling portion.

In example embodiments, the at least one doubling portion is a semicircular bent portion. In example embodiments, the at least one doubling portion is an angled portion.

Example embodiments refer to doubling portions, however, example embodiments of doubling portions may also include n-way-portions, where n is an integer>2.

BRIEF DESCRIPTION OF THE FIGURES

Example embodiments will be described with reference to the following figures, wherein like reference numerals refer to like parts throughout the various figures unless otherwise specified. In the figures.

DETAILED DESCRIPTION OF EXAMPLE EMBODIMENTS

Figure 1A:
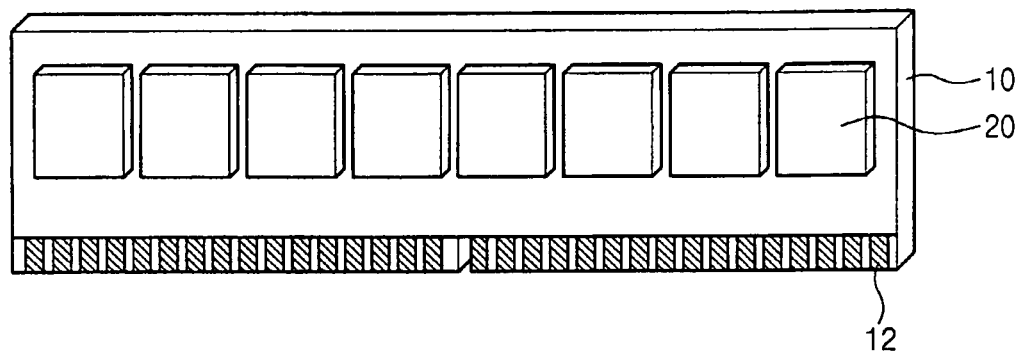
FIGS. 1A and 1B are a perspective view and a side view illustrating a conventional semiconductor memory module, respectively.
Figure 1B:
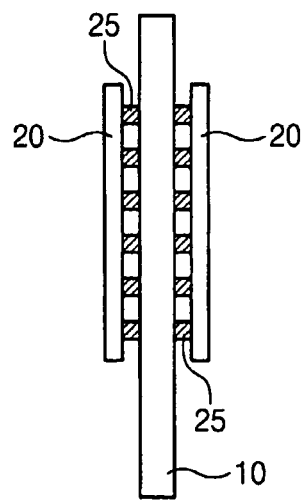

Various example embodiments will now be described more fully with reference to the accompanying drawings in which some example embodiments are shown. In the drawings, the thicknesses of layers and regions are exaggerated for clarity. It will also be understood that when a layer is referred to as being "on" another layer or substrate, it can be directly on the other layer or substrate, or intervening layers may also be present.

Detailed illustrative embodiments are disclosed herein. However, specific structural and functional details disclosed herein are merely representative for purposes of describing example embodiments. This invention may, however, may be embodied in many alternate forms and should not be construed as limited to example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used here, the term "and/or" includes any and all combinations of one or more of the associated listed items.

The terminology used herein is for the purpose of describing particular embodiments only and is not intended to be limiting. As used here, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" to another element, it can be directly connected to the other element or intervening elements may be present. Other words used to describe the relationship between elements should be interpreted in a like fashion (e.g., "between", "adjacent").

Example embodiments will now be described more fully with reference to the accompanying drawings. This invention, however, may be embodied in many different forms and should not be construed as limited to example embodiments set forth herein. Rather, example embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

FIGS. 2A, 2B, 2C and 2D are a perspective view, a side view, an enlarged view, and a side view illustrating a semiconductor memory module according to example embodiments, respectively. The semiconductor memory module may include a PCB comprising at least one rigid PCB part 110, at least one flexible PCB part 130 and at least one memory component 120.

The PCB may include the at least one rigid PCB part 110 including a first surface and a second surface facing the first surface and the at least one flexible PCB part 130 including an overlap portion 130a overlapping the rigid PCB part 110 and a non-overlap portion 130b not overlapping the rigid PCB part 110. The flexible PCB part 130 may facilitate a stacked structure and may include at least one doubling portion. In example embodiments, a doubling portion may include a semicircular bent portion 130c. For example, in FIGS. 2B and 2C, a doubling portion may compose a non-overlap portion 130b and semicircular bent portion 130c.

Figure 2A:
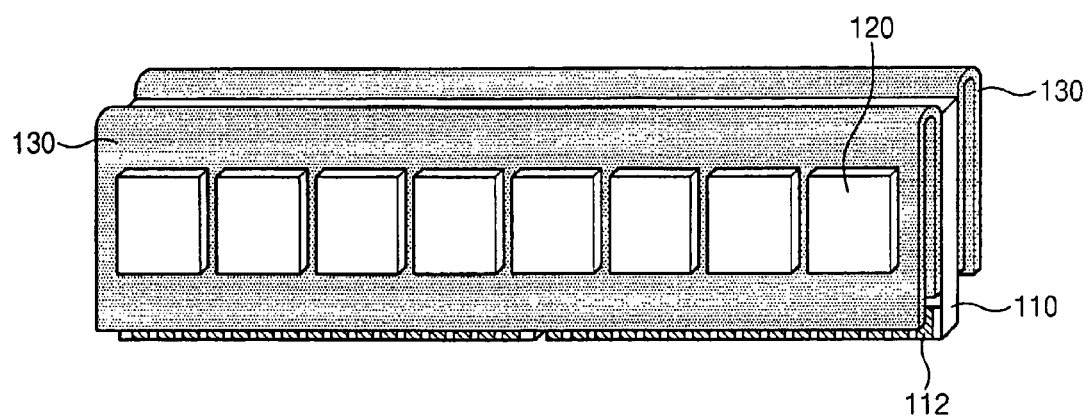
FIGS. 2A, 2B, 2C, and 2D are a perspective view, a side view, an enlarged view, and a side view illustrating a semiconductor memory module according to example embodiments, respectively.
Figure 2B:
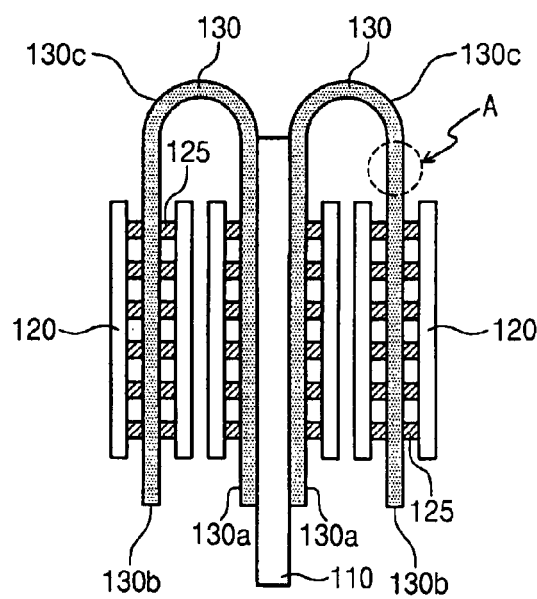
Figure 2C:
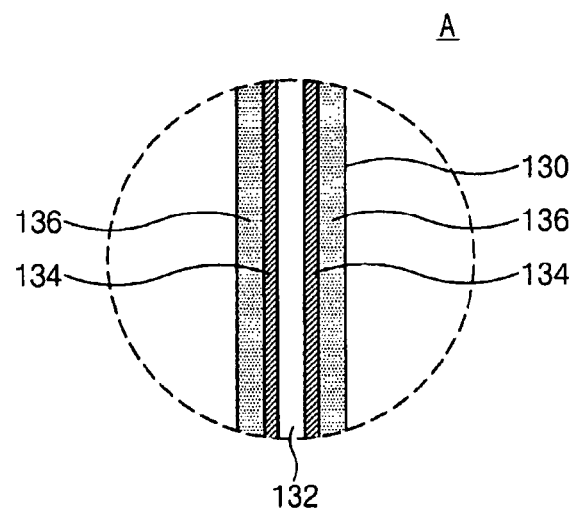

Referring to a reference character "A" of FIG. 2B and FIG. 2C, the flexible PCB part 130 may include a core material 132 including a first surface and a second surface facing the first surface, a conductive layer 134 provided on the first and second surfaces of the core material 132, respectively, and an insulating layer 136 provided on the conductive layer 134. The core material 132 may include polyimide, as well as other similar materials. The first and second conductive layers 134 may include copper (Cu), as well as other similar materials. The insulating layer 136 may include photo solder resist (PSR), polyimide, or any other similar materials. Therefore, the flexible PCB part 130 may have improved flexibility.

Referring to FIGS. 2A and 2B, a pair of overlap portions 130a of the flexible PCB part 130 may be adhered to the first and second surfaces of the rigid PCB part 110. The memory components 120 may be mounted on exposed surfaces of the pair of flexible PCB parts 130 with at least one mounting element 125. The memory components 120 may be a semiconductor memory chip or a semiconductor memory package. The mounting elements 125 may be the combination of bonding pads of the memory components 120 and joining lands provided at the surfaces of the PCB on which the memory components 120 are mounted.

Figure 4:
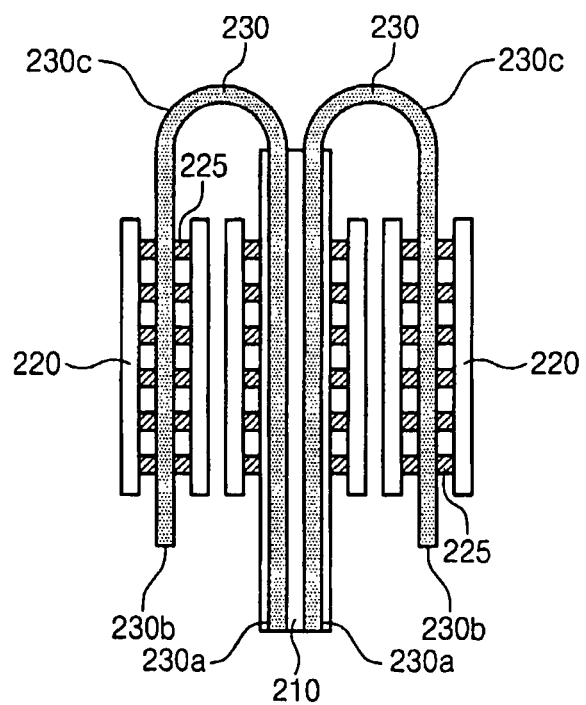
FIG. 4 is a side view illustrating a semiconductor memory module according to example embodiments wherein a pair of overlap portions of the flexible PCB part may be structured to be included in the rigid PCB part.

Alternatively, referring to FIG. 4, a pair of overlap portions 230a of the flexible PCB part 230 may be provided in the rigid PCB part 210. The memory components 220 may be mounted on exposed surfaces of the pair of flexible PCB parts 230 and the first and second surfaces of the rigid PCB part 210 with at least one mounting element 225. In example embodiments, a doubling portion may include a semicircular bent portion 230c. For example, in FIG. 4, a doubling portion may compose a non-overlap portion 230b and a semicircular bent portion 230c.

Returning to FIGS. 2A and 2B, assuming that the rigid PCB part 110 on which the memory components 120 has two mounting areas (each side of the rigid PCB part 110), if the pair of flexible PCB parts 130 each include one semicircular bent portion, the mounting area may increase by three times, for example, to six (each side of the rigid PCB part 110 and each side of both flexible PCB parts 130).

Figure 2D:
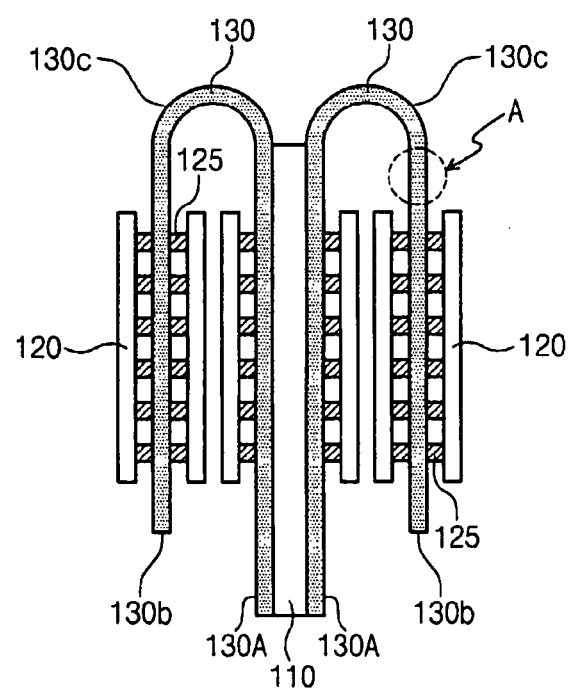

Referring to FIGS. 2A and 2D, the PCB may include connector connecting pins 112 provided at one end to be electrically connected to a main board of an electronic circuit system when the PCB is inserted into a connector of the main board. The connector connecting pins 112 may be provided at the first and second surfaces of the rigid PCB part 110. Alternatively or additionally, the connector connecting pins 112 may be provided at the surfaces of overlap portions 130A facing the overlap portions 130A of the rigid PCB part 110 and the pair of flexible PCB parts 130.

Figure 3A:
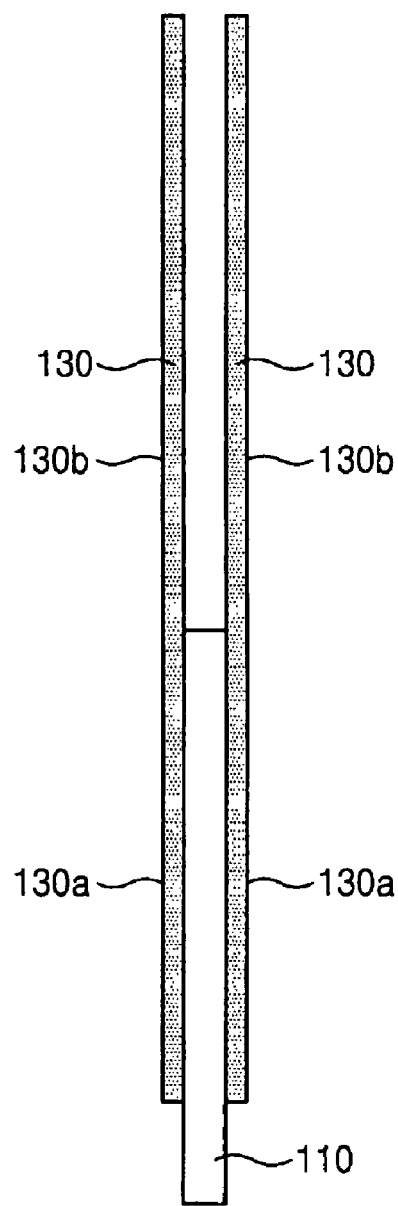
FIGS. 3A through 3C are side views illustrating a method of manufacturing a semiconductor memory module according to example embodiments.
Figure 3B:
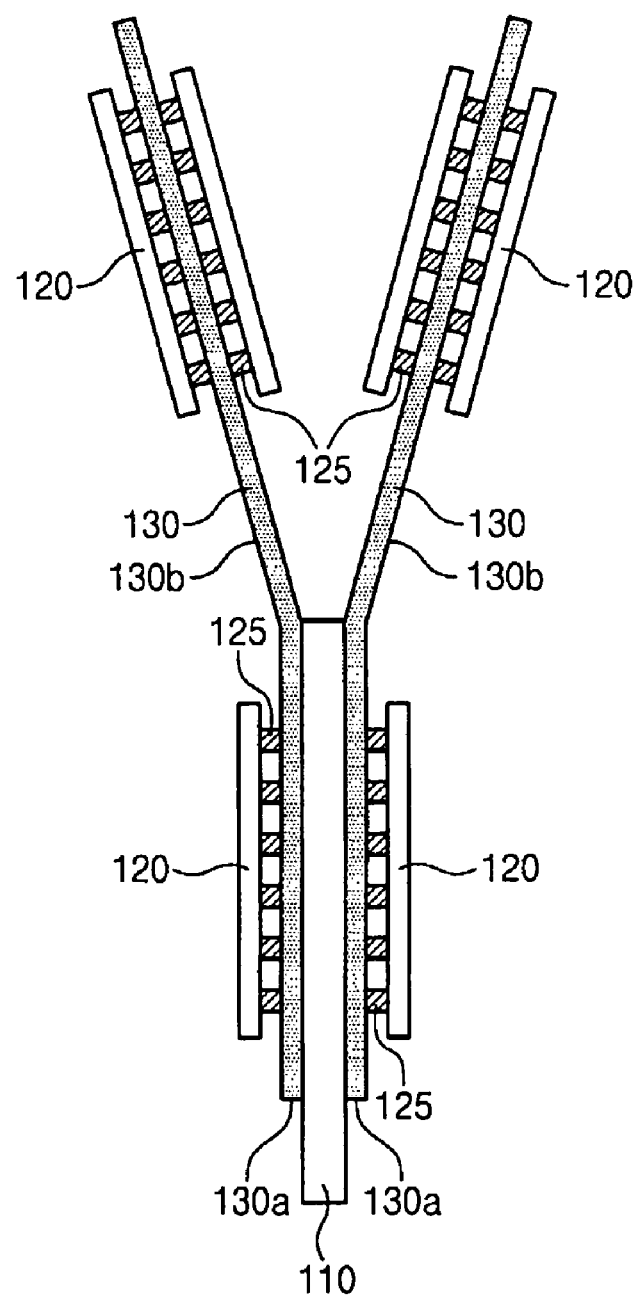
Figure 3C:
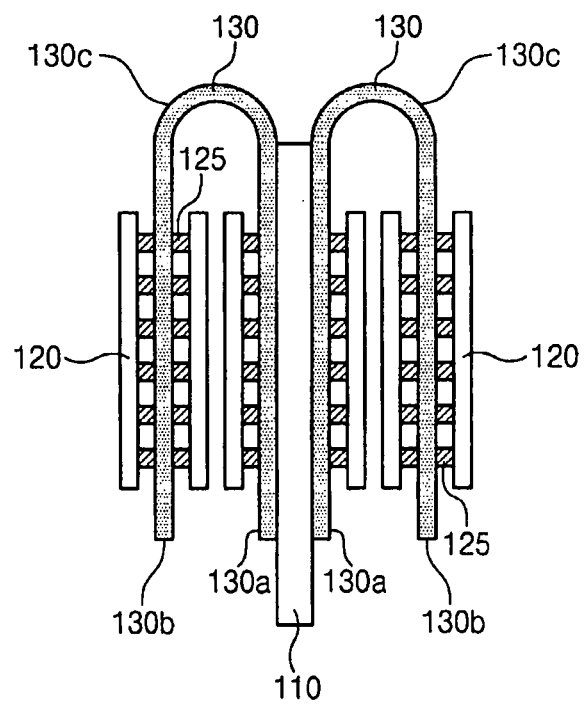

FIGS. 3A through 3C are side views illustrating a method of manufacturing a semiconductor memory module according to example embodiments.

Referring to FIG. 3A, a PCB may include a rigid PCB part 110 including a first surface and a second surface facing the first surface, a flexible PCB part 130 including an overlap portion 130a overlapping the rigid PCB portion 110, and a non-overlap portion 130b not overlapping the rigid PCB portion 110.

Referring to FIG. 3B, memory components 120 may be mounted on the exposed surfaces of the pair of flexible PCB parts 130 with at least one mounting element 125. A pair of overlap portions 130a of the flexible PCB part 130 may be structured to adhere to the first and second surfaces of the rigid PCB part 110. In example embodiments, for example, in FIGS. 3A, 3B and 3C, each doubling portion may include a non-overlap portion 130b. In example embodiments shown in FIGS. 3A-3C, the doubling portions are represented as angled portions branching off at any desired angle and in any number.

Alternatively, referring to FIG. 4, a pair of overlap portions 230a of the flexible PCB part 130 may be included in the rigid PCB part 110. The memory components 120 may be mounted on exposed surfaces of the pair of flexible PCB parts 130 and the first and second surfaces of the rigid PCB part 110.

Referring to FIG. 3C, the non-overlap portion 130b of the pair of flexible PCB parts 130 of the PCB may be bent in the opposite direction in relation to the overlap portion to have an overlap stacked structure. The overlap stacked structure may include the memory components 120 mounted on the exposed surface of the PCB to be disposed adjacent to each other, similar to a stacked structure.

Assuming that the rigid PCB part 110 on which the memory components 120 has two mounting areas (each side of the rigid PCB part 110), if the pair of flexible PCB parts 130 each include doubling portion, the mounting area may increase by three times, for example, to six (each side of the rigid PCB part 110 and each side of both flexible PCB parts 130). Thus, memory capacity of the semiconductor memory module may increase.

Figure 5:
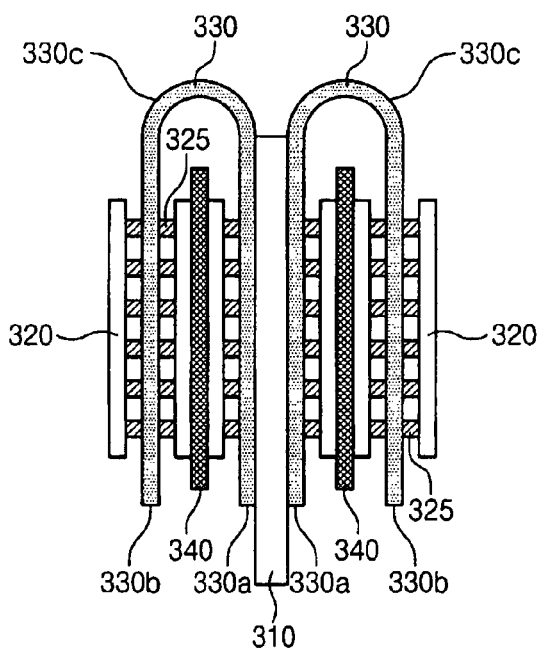
FIG. 5 is a side view illustrating a semiconductor memory module according to example embodiments wherein a fixing means is provided between adjacent memory components.
Figure 6:
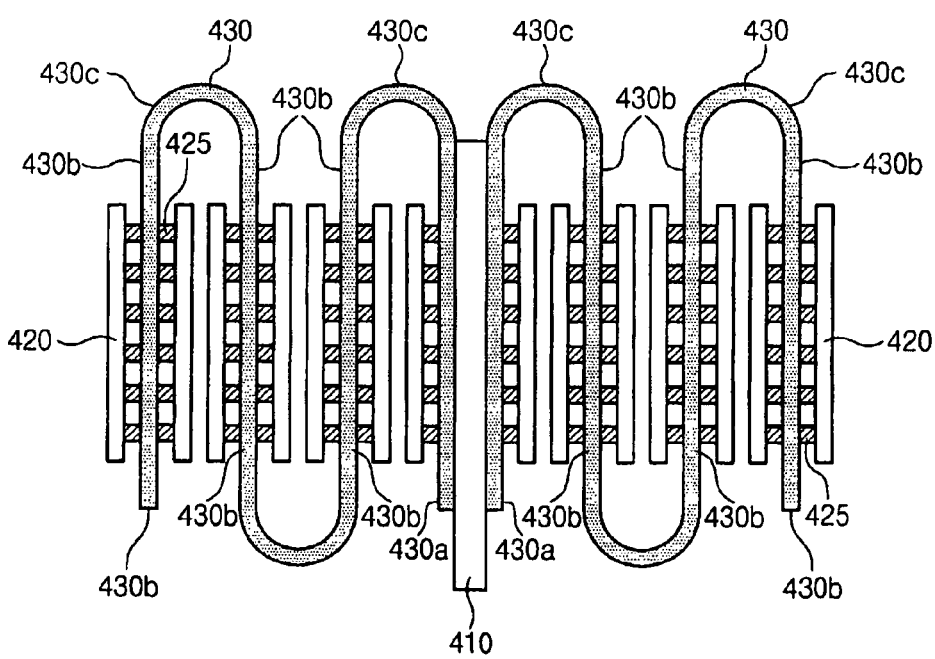
FIG. 6 is a side view illustrating a semiconductor memory module according to an example embodiment, wherein the PCB includes at least three doubling portions.

FIGS. 5 and 6 are side views illustrating semiconductor memory modules according to example embodiments.

Referring to FIG. 5, a PCB of a semiconductor memory module may have a structure in which overlap portions 330a of a pair of flexible PCB parts 330 adhere to a first surface and a second surface facing the first surface of a rigid PCB part 310. In example embodiments, a doubling portion may include a semicircular bent portion 330c. For example, in FIG. 5, a doubling portion may compose a non-overlap portion 330b and semicircular bent portion 330c.

Memory components 320 may be mounted on exposed surfaces of the pair of flexible PCB parts 330 with at least one mounting element 325. Assuming that the rigid PCB part 310 on which the memory components 320 has two mounting areas (each side of the rigid PCB part 310), if the pair of flexible PCB parts 330 each include one semicircular bent portion, the mounting area may increase by three times, for example, to six (each side of the rigid PCB part 310 and each side of both flexible PCB parts 330). Thus, memory capacity of the semiconductor memory module may increase.

At least one fixing element 340 may be provided between adjacent memory components 320. The at least one fixing element 340 may be adhesive material, heat sink, as well as any other similar materials. If the at least one fixing element 340 is an adhesive material, the mechanical reliability of the semiconductor memory module may be enhanced. If the at least one fixing element 340 is a heat sink, the mechanical reliability and/or the thermal stability of the semiconductor memory module may be enhanced. The heat sink may include steel use stainless (SUS) steel, high carbon steel, or any other similar material.

Referring to FIG. 6, a PCB of a semiconductor memory module may include a pair of flexible PCB parts 430, each including three semicircular bent portions wherein the pair of flexible PCB parts 430 have an overlap stacked structure. In example embodiments, a doubling portion may include a semicircular bent portion 430c. For example, in FIG. 6, a doubling portion may compose a non-overlap portion 430b and semicircular bent portion 430c Assuming that the rigid PCB part 410 on which the memory components 420 has two mounting areas (each side of the rigid PCB part 410), if the pair of flexible PCB parts 430 each include three semicircular bent portions, the mounting area may increase by seven times, for example, to 14 (each side of the rigid PCB part 410 and each side of both flexible PCB parts 430). Thus, memory capacity of the semiconductor memory module may increase.

Thus, assuming that a mounting area of the rigid PCB part 410 on which the memory components 420 are mounted is 1, if the number of semicircular bent portions is n, a mounting area of a PCB on which memory components 420 are mounted is 2n+1.

Example embodiments refer to doubling portions, however, example embodiments of doubling portions may also include n-way-portions, where n is an integer>2.

While example embodiments have been particularly shown and described with reference to example embodiments thereof, it will be understood by those of ordinary skill in the art that various changes in form and details may be made therein without departing from the spirit and scope of the following claims.

What is claimed is:

1. A semiconductor memory module comprising:
a printed circuit board (PCB) including,
a rigid PCB part; and
a flexible PCB part including an overlap portion overlapping the rigid PCB part and a non-overlap portion not overlapping the rigid PCB part, wherein the flexible PCB part includes an overlap stacked structure including at least one doubling portion;
memory components mounted on at least one surface of the PCB; and
at least one fixing element between adjacent memory components, wherein the at least one fixing element is an adhesive material or a heat sink.

2. The PCB of claim 1, wherein the flexible PCB part is a pair of flexible PCBs.

3. The PCB of claim 1, wherein the overlap portion resides within the rigid PCB part.

4. The PCB of claim 1, wherein the rigid PCB part includes connector connecting pins provided at a surface of the rigid PCB part.

5. The PCB of claim 1, wherein the overlap portion adheres to the rigid PCB part.

6. The PCB of claim 1, wherein the flexible PCB part comprises:
a core material;
a conductive layer; and
a first insulating layer.

7. The semiconductor memory module of claim 1, wherein a number of the at least one doubling portions is n (where n is an integer greater than or equal to one), and a mounting area of the PCB on which the memory components are mounted is (2n+1) times as much as a mounting area of the rigid PCB.

8. The semiconductor memory module of claim 1, further comprising:
at least one mounting element between surfaces of the PCB and the memory components.

9. The PCB of claim 5, wherein the flexible PCB part includes connector connecting pins provided at a surface of the overlap portions facing the boundary surfaces between the rigid PCB part and the overlap portion.

10. The PCB of claim 6, wherein the core material is polyimide.

11. The PCB of claim 6, wherein the conductive layer is copper (Cu).

12. The PCB of claim 6, wherein the insulating layer is photo solder resist or polyimide.

* * * * *